US006625637B1

(12) United States Patent
Cuesta et al.

(10) Patent No.: US 6,625,637 B1
(45) Date of Patent: Sep. 23, 2003

(54) METHOD AND APPARATUS FOR SYNTHESIZING COMMUNICATION SUPPORT BASED ON COMMUNICATION TYPES OF APPLICATION

(75) Inventors: Fernand Cuesta, Golfe Juan (FR); Michel Auguin, Cagnes sur Mer (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/458,585

(22) Filed: Dec. 9, 1999

(51) Int. Cl.[7] .............................................. G06F 15/16
(52) U.S. Cl. ........................ 709/102; 710/61; 710/260
(58) Field of Search ................................ 709/201, 232, 709/200, 102; 710/260–69, 61

(56) References Cited

U.S. PATENT DOCUMENTS

| | | | | | |
|---|---|---|---|---|---|
| 4,317,169 | A | * | 2/1982 | Panepinto et al. | 711/106 |
| 4,593,282 | A | * | 6/1986 | Acampora et al. | 340/825.5 |
| 5,640,433 | A | * | 6/1997 | Szczebak et al. | 375/377 |
| 5,652,712 | A | * | 7/1997 | Szczebak et al. | 702/85 |
| 5,654,969 | A | * | 8/1997 | Wilhelmsson | 370/460 |
| 5,701,502 | A | * | 12/1997 | Baker et al. | 709/201 |
| 5,909,560 | A | * | 6/1999 | Kenny et al. | 710/305 |
| 6,038,629 | A | * | 3/2000 | Ogilvie et al. | 710/312 |
| 6,068,661 | A | * | 5/2000 | Shari | 703/27 |
| 6,084,851 | A | * | 7/2000 | Iwasaki | 370/204 |
| 6,181,257 | B1 | * | 1/2001 | Meek et al. | 340/870.01 |
| 6,219,711 | B1 | * | 4/2001 | Chari | 709/232 |
| 6,256,390 | B1 | * | 7/2001 | Okuyama et al. | 380/201 |
| 6,351,271 | B1 | * | 2/2002 | Mainwaring et al. | 345/744 |
| 6,434,161 | B1 | * | 8/2002 | Higbee et al. | 370/413 |
| 6,473,869 | B2 | * | 10/2002 | Bissett et al. | 714/12 |
| 6,487,198 | B1 | * | 11/2002 | Pierson, Jr. | 370/356 |
| 6,502,205 | B1 | * | 12/2002 | Yanai et al. | 714/7 |

FOREIGN PATENT DOCUMENTS

EP 0875827 A2 11/1998
EP 0875827 A3 2/1999

OTHER PUBLICATIONS

IBM Technical Disclosure Bulletin, "Mechanism for connecting to a Synchronous Time–Division Multiplexed Bitstream using Asynchronous Strobed Transfers". Dec. 1, 1994, US, pp. 371–374.*

Lindgren et al., "Bitstream Management". U.S. pat. application publication No. 2002/0126688 A1.*

L. Freund et al., "*A Codesign Experiment in Acoustic Echo Cancellation: GMDF a*", ACM Transactions on Design Automation of Elec. Systems, Oct. 1997, vol. 2, No. 4, pp. 365–383, France.

* cited by examiner

*Primary Examiner*—John Follansbee
*Assistant Examiner*—Lilian Vo
(74) *Attorney, Agent, or Firm*—Peter Zawilski

(57) ABSTRACT

Disclosed are method and apparatus for synthesizing communication support based on communication types of an application. In the integrated circuit design method, an application schedule is provided for the application. The application schedule describes a plurality of units for performing specified tasks and one or more communication links between the specified tasks. After receiving the application schedule, the communication type is determined for each of the communication links in the application schedule as an asynchronous communication or a synchronous communication. Then, for each of the asynchronous communications, it is determined whether each asynchronous communication can be transformed into a semi-synchronous communication that uses an interrupt and a bus to transfer data. A communication support is synthesized for the semi-synchronous communications as synchronous communications by using the interrupt and the bus. In addition, a communication support may be synthesized for the asynchronous communications that were determined not to be semi-synchronous communications.

20 Claims, 13 Drawing Sheets

METHOD AND APPARATUS FOR SYNTHESIZING COMMUNICATION SUPPORT BASED ON COMMUNICATION TYPES OF APPLICATION

BACKGROUND OF THE INVENTION

1. Field of the Invention

This invention relates generally to the field of integrated circuit designs. More particularly, the present invention relates to automated design of integrated circuits by synchronizing asynchronous communications.

2. Description of the Related Art

Modern electrical devices typically include one or more integrated circuit (IC) chips designed to meet specific performance requirements. As integrated circuits become more complex, it becomes more desirable for logic designers to have the ability to quickly implement complex function blocks into integrated circuit designs. In addition, as applications become more complex requiring more complex processing, designers are called upon to rapidly analyze an increasing number of possible solutions. To permit easier logic design of custom or semi-custom ICs to fulfill performance constraints or circuit requirements and to aid in circuit fabrication, automated systems for design and manufacturing have been developed. For example, automated design systems using computer-aided design (CAD) are routinely used to design highly complex ICs and ICs having short life cycles such as embedded systems.

One type of CAD systems is known as a "logic synthesis system." In logic synthesis systems, inputs, outputs and a high-level design description are entered into a computer using a hardware description language (HDL). Then, using a synthesis software, the computer creates a logic design that performs the function described in the HDL.

In general, short life cycle systems such as embedded systems often include one or more multiprocessors, which are used to order the tasks of an application in parallel to satisfy time constraints. Thus, in such systems, several processors may be connected in one or more ICs by communication interfaces such as data buses for synchronous transfer or communication memory (e.g., FIFO, dual port, etc.) for asynchronous transfer. However, conventional approaches have generally designed the communication interfaces in such systems in a generic way instead of optimizing them for specific applications.

By way of example, FIG. 1A illustrates a block diagram depicting an exemplary library 100 of design units. As shown, the library 100 includes design units such as processors P1 and P2 and hardware HW1 and HW2. Each of the design units in the library 100 is capable of performing assigned tasks. For example, processor P1 may be used to perform tasks T1, T2, T3, and T4 while processor P2 can perform a task T13. Similarly, hardware HW1 may perform tasks T5, T6, T7, and T8 while hardware HW2 can be used to perform tasks T9, T10, T11, and T12. Typically, the tasks T1 to T13 are provided in a library as functions.

FIG. 1B shows modeling of an application 120 using functions and design units from the library 100. In this application modeling, tasks are represented as nodes, which are connected to one another through edges as indicated by arrows. The edges indicate communication links while the tasks represent functions. The application 120 in modeled by task nodes and communication edges. Specifically, the processor P1 is assigned tasks T1, T2, T3, and T4, which are linked to the nodes of tasks T5, T6, T7, and T8, respectively, of hardware HW1 via communication edges E1, E2, E3, and E4, respectively. The hardware HW2 is assigned tasks T9, T10, T11, and T12, which are linked to the nodes of tasks T5, T6, T7, and T8, respectively via communication edges E5, E6, E7, and E8, respectively. The task T13 of processor P2 is linked to the nodes of tasks T9, T10, T11, and T12 via communication edges E9, E10, E11, and E12.

FIG. 1C is a schematic diagram depicting a scheduling of the application 120 modeled in FIG. 1B. In this schedule diagram, the assigned tasks of the design units are scheduled as a function of time. Specifically, the tasks of each of the design units are assigned a specified time duration and scheduled in sequence. For example, the tasks of the processor P1 are scheduled in sequence of T1, T2, T3, and T4 and the tasks of hardware HW1 are scheduled in the order of T5, T6, T7, and T8. Similarly, the tasks of hardware HW2 are scheduled in sequence of T9, T10, T11, and T12.

In this configuration, the communication edges that connect the task nodes in the application 120 are scheduled as either synchronous or asynchronous communications. The determination of synchronous or asynchronous communication between a transmitting unit (i.e., transmitter) and a receiving unit (i.e., receiver) is made by the availability of the receiver unit upon completion of a task by the transmitter. If the receiver is not performing a task at the completion of the task by the transmitter, the communication is characterized as synchronous. Otherwise, the communication is asynchronous. For example, communications 152, 160, 162, 164, 166, 168, and 176 are synchronous communications while communications 156, 158, 170, 172, and 174 are asynchronous communications.

The characterization of a communication as either a synchronous or an asynchronous communication affects synthesis of the application. Typically, a synchronous communication is synthesized and implemented using a bus for communication data between two or more design units. On the other hand, an asynchronous communication is generally synthesized and implemented using a first-in-first-out buffer (FIFO), dual port, or the like to store the data for synchronization.

The application schedule of FIG. 1C can be used to synthesize an architecture of a system 180 for the application 120 as shown in FIG. 1D. The system 180 includes processors P1, P2, hardware HW1, and HW2. In addition, the system includes a pair of FIFOs: FIFO1 and a FIFO2. The FIFO1 is provided between processor P1 and hardware HW1 to allow asynchronous communications. Likewise, the FIFO2 allows asynchronous communications between hardware HW2 and processor P2.

Unfortunately, however, a FIFO, in particular, and communication memory in general, typically require a larger area in an IC chip to implement than a bus. This means that a system having a FIFO or communication memory is usually more costly to implement than one having a bus. Furthermore, due to the short life cycle of embedded systems, conventional methods, in general, have not efficiently optimized the asynchronous communications to reduce cost and die area.

Thus, what is needed is a method and apparatus for efficiently implementing asynchronous communications without attendant cost and die area required in conventional techniques.

SUMMARY OF THE INVENTION

Broadly speaking, the present invention fills these needs by providing a method and apparatus for synthesizing communication support based on communication types of an application. It should be appreciated that the present invention can be implemented in numerous ways, including as a process, an apparatus, a system, a device, or a method. Several inventive embodiments of the present invention are described below.

The present invention provides a method synthesizing communication support based on communication types of an application. In this method, an application schedule is provided for the application. The application schedule describes a plurality of units for performing specified tasks and one or more communication links between the specified tasks. After receiving the application schedule, the communication type is determined for each of the communication links in the application schedule as an asynchronous communication or a synchronous communication. Then, for each of the asynchronous communications, it is determined whether each asynchronous communication can be transformed into a semi-synchronous communication that uses an interrupt and a bus to transfer data. A communication support is synthesized for the semi-synchronous communications as synchronous communications by using the interrupt and the bus. In addition, a communication support may be synthesized for the asynchronous communications that were determined not to be semi-synchronous communications.

In another embodiment, the present invention provides an integrated circuit design tool for synthesizing communication support based on communication types of an application. The integrated circuit design tool includes (a) means for providing an application schedule for the application, the application schedule having plurality of units for performing specified tasks and one or more communication paths between the specified tasks; (b) means for determining a communication type for each of the communication paths in the application schedule as an asynchronous communication or a synchronous communication; (c) means for determining, for each of the asynchronous communications, whether each asynchronous communication can be transformed into a semi-synchronous communication that uses an interrupt and a bus to transfer data; (d) means for synthesizing a first hardware support for the semi-synchronous communications as synchronous communications by using the interrupt and the bus; and (e) means for synthesizing a second hardware support for the asynchronous communications that are not semi-synchronous communications by using a communication memory.

The method and apparatus of the present invention provide reduced the size of the hardware dedicated to the communications while preserving the objective of application performance. In particular, the identification of asynchronous communications that can be transformed into semi-synchronous communications allows use of a synchronous bus and an interrupt mechanism to replace conventional FIFOs. Implementing a bus in an IC chip allows substantial savings in surface area with attendant savings in cost. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

In the following detailed description of the present invention, a method and apparatus for synthesizing communication support based on communication types of an application, numerous specific details are set forth in order to provide a thorough understanding of the present invention. However, it will be obvious to one skilled in the art that the present invention may be practiced without some or all of these specific details. In other instances, well known circuits, systems, and process operations have not been described in detail in order not to unnecessarily obscure the present invention.

The present invention carries out transfers of data between units in a synchronous way. For synchronous transfers between two units, the communication support will be a bus, which takes less surface than a FIFO or all other storing system. To carry out this synchronization of the communications, task of mobility is used to synchronize the transmission and the reception between a transmitting unit and a receiving unit. Then, to take into account data storage requirement needed for inter-unit communication, an interrupt driven mechanism is used to transfer data between the transmitting unit and the receiving unit. Thus, asynchronous communication can have a synchronous transfer.

The method and apparatus of the present invention provide reduced the size of the hardware dedicated to the communications while preserving the objective of application performance. Additionally, the present invention allows the definition of a bench of communication support optimized in area. Further, it can estimate the overhead of the communication support on an existing multiprocessor circuit often called "predefined system" depending on the application that will be implemented on this circuit.

Figure 2:
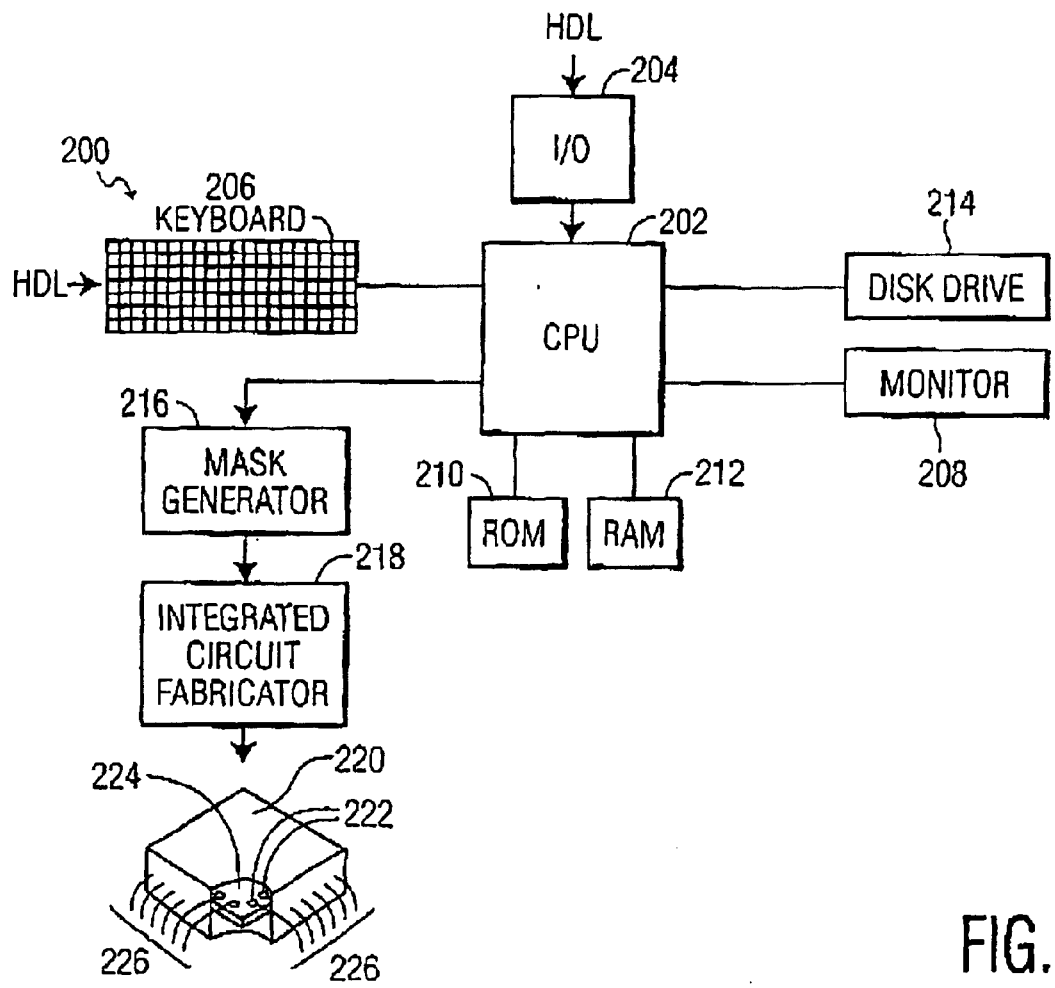
FIG. 2 shows a block diagram of an integrated circuit fabrication system in accordance with one embodiment of the present invention.

FIG. 2 shows a block diagram of an integrated circuit fabrication system 200 in accordance with one embodiment of the present invention. The system 200 includes a processor (e.g., CPU) 202, an I/0 port 204, a keyboard 206, a monitor 208, ROM 210, RAM 212, a disk drive unit 214, a mask generator 216, and an IC fabricator 218. The processor 202 is coupled to I/O port 204 and to a user-input device such as keyboard 206. HDL can be received and input into the system 200 through the I/O port 204, the user input device 206 or another input channel such as disk drive 214. Integrated circuit fabrication systems are often referred to as integrated circuit fabrication tools and are described, for example, in U.S. Pat. No. 5,963,454, entitled "Method and Apparatus for Efficiently Implementing Complex Function Blocks in Integrated Circuit Designs," by Dockser et al., which is incorporated herein by reference.

The system 200 is preferably provided with various types of digital storage capacity such as ROM 210, RAM 212, and the disk drive 214. The disk drive 214 may be used to store HDL received from the I/O ports 204 or the user input device 206 or may be used to enter HDL into the system, and it may store mask generation data created by processes running on the system 200 and its processor 202. The disk drive 214 may be replaced or augmented by other permanent storage devices such as magnetic tape or floppy disks. Inputs such as application model, design constraints, predesigned systems, library of design units and functions, application schedule, and communication list can be either entered through, for example, the I/O port 204 or the user input device 206, or they may be synthesized directly on the system 200.

Based on the inputs, the system 200 synthesizes hardware design and develops ask generation data. This mask generation data may be stored in digital storage, as for example the disk drive 214. The mask generator 216 receives the mask generation data from the processor 202. Alternatively, (not shown) the mask generator 216 may receive mask generation data directly from digital storage such as the disk drive 214. The mask generator 216 may be part of the system 200, or it may be a separate device. The mask generation data is used by the mask generator 216 to create photolithography masks. These masks will be used in an integrated circuit fabricator 218 to form components of the integrated circuit on a wafer. The mask will be sufficient to create the components on the integrated circuit and the connections between the components. The integrated circuit fabricator 218 includes semiconductor manufacturing equipment such as etchers, chemical vapor deposition (CVD) machines, lithography machines, etc. as is well known to those skilled in the art of semiconductor manufacturing.

The final result of processing by system 200 is a packaged integrated circuit 220. This packaged IC 220 will contain a die 224 created from using the mask created by the mask generator 216. The semiconductor die 224 typically contains a digital integrated circuit and I/O pads 222 for coupling the circuit to several leads 226. The I/O pads 222 can be coupled to the leads 226 in any conventional manner such as, by bonding wires.

Figure 3:
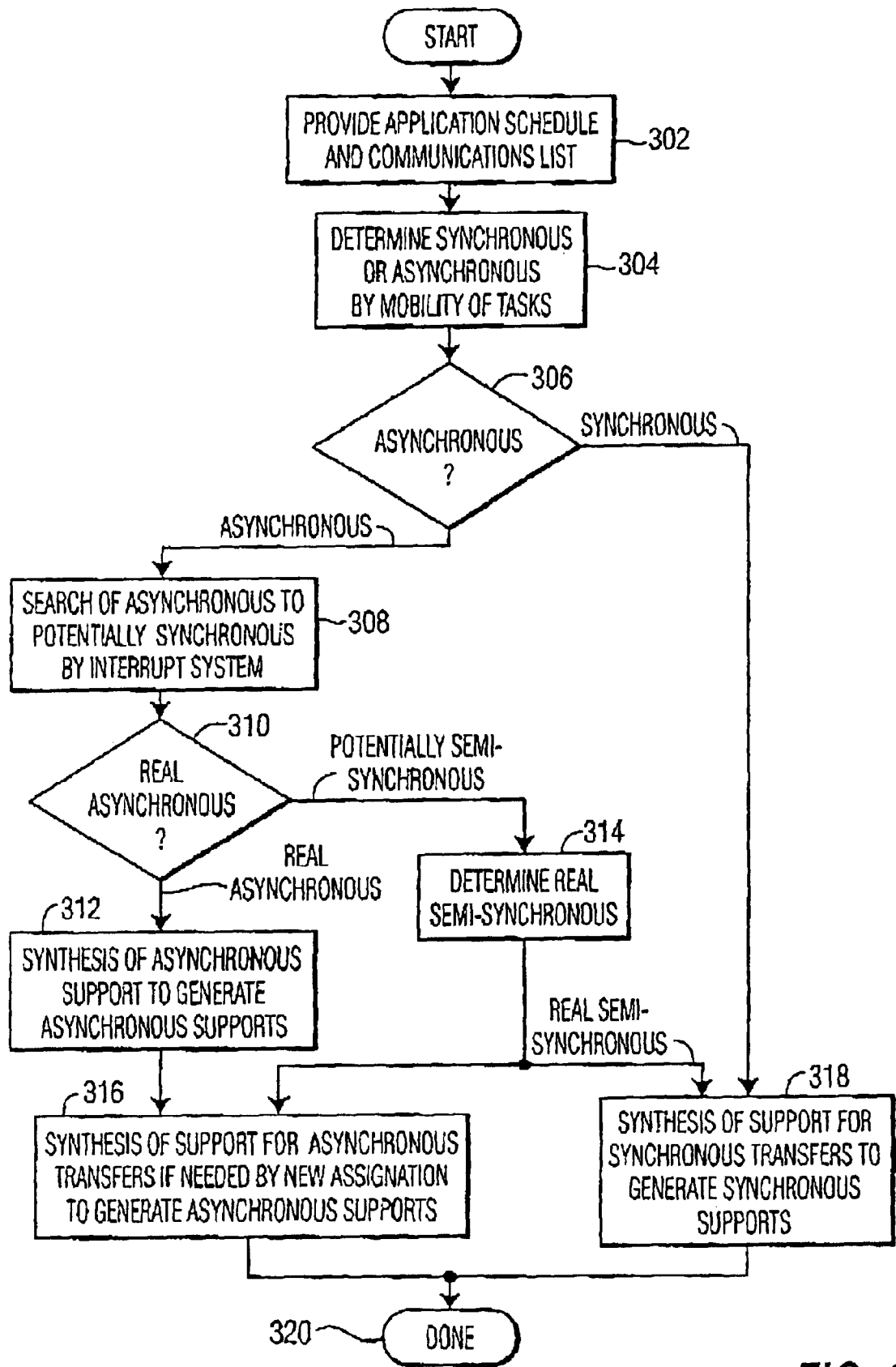
FIG. 3 shows a flowchart of a method for developing an integrated circuit design in accordance with one embodiment of the present invention.

FIG. 3 shows a flowchart of a method for developing an integrated circuit design in accordance with one embodiment of the present invention. In this method, hardware communication units are allocated through a multi-step characterization process of the communication. The method begins in operation 302, where application schedule and communications list are provided as inputs. In one embodiment, the application scheduling is provided for a multiprocessor system with known starting and ending dates of all tasks. For example, a model where all data transfers is done at the end of the transmitting task and at the beginning of the receiving task. The communications list includes information of all communications between units according to the scheduling.

Then in operation 304, communication between units is determined to be either synchronous or asynchronous using methods such as mobility of tasks. For example, task 1 may communicate with task 2 in either synchronous or asynchronous mode. When there is an overlap of temporal mobility of transmission and reception, the transfer can be done in a synchronous way. Otherwise, the transfer cannot be done in a synchronous manner, and instead, is carried out in an asynchronous communication using a communication memory such as FIFO. The determination of synchronous or asynchronous communication by mobility of task will be discussed in more detail in FIGS. 4A to 4C.

In accordance with one embodiment, the set of communications in the communication list is divided into two subsets: a subset of synchronous communications and a subset of asynchronous communications. For the communications determined as synchronous in operations 304 and 306, the method proceeds to operation 318, where support for synchronous transfers are synthesized. On the other hand, for the communications determined as asynchronous in operations 304 and 306, the method proceeds to operation 308, where one or more seek operations are performed in the class of the asynchronous communications. The seek operations are used to determine whether the asynchronous communications can potentially be transformed into semi-synchronous by using receiver and transmitter storing algorithms.

Those asynchronous communications that are not potentially semi-synchronous communications are real asynchronous communications. In this case, the method proceeds, via operation 310, to operation 312, where asynchronous support is synthesized for the real asynchronous communication. In this operation, a determination of hardware requirements is made so that the memory requirements for the asynchronous communications is minimized. This can be obtained by the application of a weighted bipartite matching algorithm, which is well known in the art, on the remaining synchronous communications. If the synthesis is applied to a predefined system, this level uses the communication hardware information (e.g., buses, dual port, etc.) that is available in the predefined system.

After the synthesis of asynchronous support, the resources can be allocated for semi-synchronous and synchronous communications. For those asynchronous communications that have been determined to be potentially semi-synchronous, it is determined whether the potentially semi-synchronous communications are real semi-synchronous by determining where the data of the semi-synchronous communications must be stored. The operation of allocating communication data preferably takes into account the availability of free memory in the units according to the scheduling. In one embodiment, such allotment is made using the cost $\gamma$. For example, units often include memory, the allotment of communication data may be on a receiving side (e.g., receiver), transmitting side (e.g., transmitter), or a communication memory detected at previous operation 312. If any of these localization are possible without causing insufficient space for storage capacity, the localization with the lowest additional cost is extended.

If potentially semi-synchronous communications remain asynchronous, a new synthesis of support is executed in operation 316 to obtain a minimum number of support hardware for asynchronous communications. By way of example, if communication memory is to be used, the transfer is asynchronous (i.e., not real semi-synchronous). In this case, support is synthesized for asynchronous transfers as needed by new assignation in operation 316 to generate asynchronous supports. For example, a communication memory is added and a new communication hardware may be established.

For real semi-synchronous communications, the semi-synchronous communications are defined as receiver or transmitter. As a result of this characterization, the times associated with these transfer events are known. The communication hardware can now be optimized for the synchronous and semi-synchronous types at the same time as synchronous transfers because they both use the same hardware types such as a bus. As will be described in more detail below, the optimization is carried out in operation 318, where support for the synchronous transfers is synthesized. The method then terminates in operation 320.

Figure 4A:
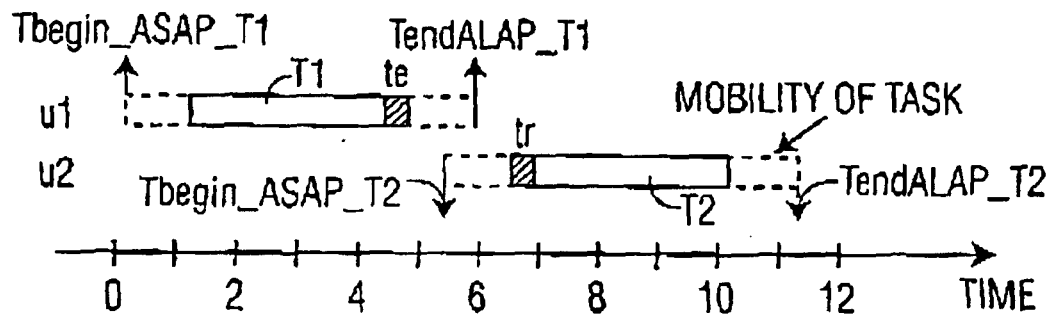
FIGS. 4A–4C show more detailed timing diagrams for illustrating mobility of task for determining synchronous or asynchronous communication.
Figure 4B:
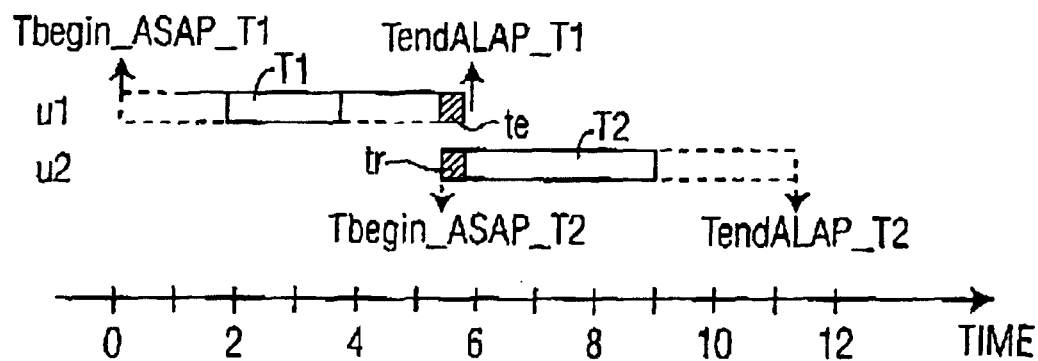
Figure 4C:
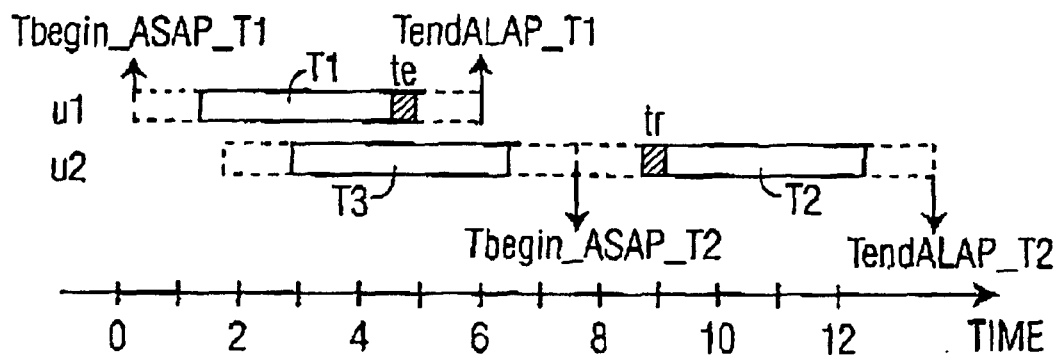

FIGS. 4A–4C show more detailed timing diagrams for illustrating mobility of task for determining synchronous or asynchronous communication. In these diagrams, te refers to time for emission of communication and tr denotes time for reception of communication. In addition, u1 refers to a transmitter and u2 denotes a receiver. Between the transmitter u1 and the receiver u2, the time mobility results from the as-soon-as-possible (ASAP) and the as-late-as-possible (ALAP) scheduling of the tasks. However, if the communication units are handling the interrupt mechanism (as in the case of software components in general), it is possible to carry out a synchronous transfer, even if there is no possible overlap of mobility. A communication synchronized by this method is called "semi-synchronous".

With reference to the beginning time Tbegin_ASAP_T1, the tasks T1 and T2 may be moved due to the maximum time of the application. For example, tasks T1 and T2 have execution times of 3.5 while the communication time is 0.5. In this case, if the maximum time of the application is 12, the task T1 can be carried out between time 0 (Tbegin) and time 3.5 (Tend). The communication can be carried out between units u1 and u2 from time 3.5 (Tbegin) to time 4 (Tend). The task T2 may be carried out from time 4 (Tbegin) to 7 (Tend). The time constraint of 12 is respected. Tbegin_ASAP_T1 is determined to be time 0.

Alternatively, the task T2 may be terminated at time 12 Tmax application and also Tend of T2. So, Tbegin of task T2 is time 8.5. The communication between units u1 and u2 can be carried out between time 8 (Tbegin) and time 8.5 (Tend). The task T1 can be carried out from time 5 (Tbegin) to time 8 (Tend). The time constraint of 12 is also respected. The time Tbegin_ALAP_T1 is time 5. Thus, the beginning time Tbegin of a task can move from Tbegin_ASAP to Tbegin_ALAP. Such a process is referred herein as "mobility of task."

Applying mobility of tasks, a communication can be determined to be either synchronous or asynchronous. For example, a communication between two tasks is determined to be an asynchronous communication when Tbegin_ASAP_T2 is greater than TendALAP_T1 in communication between tasks T1 and T2. Otherwise, the communication is a synchronous communication. Mobility of task is well known in the art and is described in more detail in the following APPENDIX.

Figure 5A:
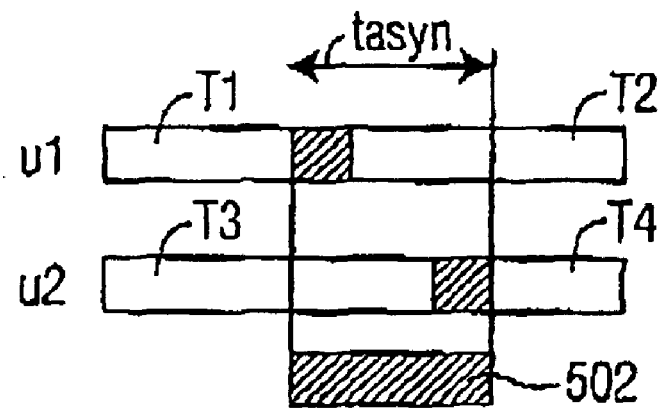
FIG. 5A illustrates a schematic diagram showing an asynchronous communication from task T1 of transmitter u1 to task T4 of receiver u2.

In accordance with preferred embodiment, the present invention carries out an synchronous transfer classified in operation 304 of FIG. 3 as a synchronous communication by providing interrupt handling capability to the communication units. By way of example, FIG. 5A illustrates a schematic diagram showing an asynchronous communication from task T1 of transmitter u1 to task T4 of receiver u2. The asynchronous communication is shown by time $t_{asyn}$ caused by a lengthy task T3. The asynchronous communication between tasks T1 and T4 would have required a FIFO in conventional communication synthesis systems.

The synchronization of asynchronous communication is performed by storing communication data in either the receiver u2 or transmitter u1. In receiver storing method of the present invention, when the transmitter transmits data, it asserts an interrupt at the end of the associated task. The receiver interrupts the task in progress (e.g., T3) to allow the transmitter to transmit the data in a synchronous manner to the receiver. The receiver stores the data in its internal memory until the task, which needs the received data, is ready to be carried out.

Figure 5B:
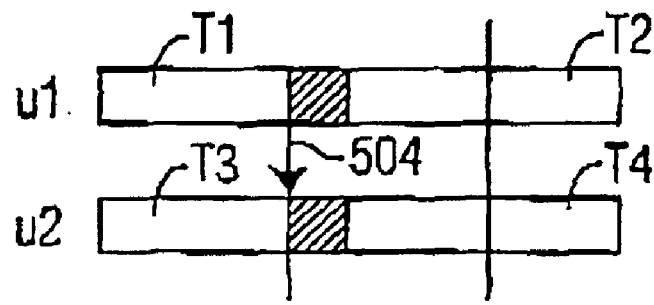
FIG. 5B shows a schematic diagram for synchronizing an asynchronous communication task T1 towards task T4 by storing data in the receiver u2 in accordance with one embodiment of the present invention.

FIG. 5B shows a schematic diagram for synchronizing an asynchronous communication task T1 towards task T4 by storing data in the receiver u2 in accordance with one embodiment of the present invention. As shown, transmitter u1 carries out tasks T1 and T2 while receiver u2 carries out tasks T3 and T4. In contrast, FIG. 5B shows transmitter u1 asserting an interrupt 504 to receiver u2. The interrupt allows the transfer of data from the transmitter u1 to receiver u2 to be carried out in a synchronous manner by a bus rather than a FIFO. The receiver u2 stores the data until task T4 can be carried out at a later time.

In an alternative embodiment, the transmitter may store data instead of the receiver for synchronizing asynchronous communications. Specifically, when transmitting data, the transmitter stores the communication data in its own internal memory. When the receiver wants the data, it asserts an interrupt to the transmitter, which then suspends the task in progress on itself and transmits the stored data to the receiver.

Figure 5C:
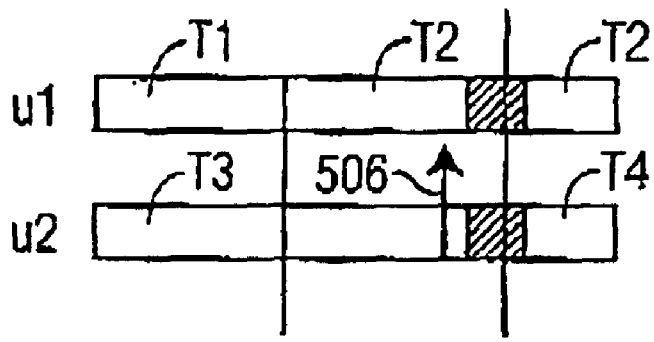
FIG. 5C shows a schematic diagram for synchronizing an asynchronous communication task T1 towards task T4 by storing data in the transmitter u1 in accordance with one embodiment of the present invention.

FIG. 5C shows a schematic diagram for synchronizing an asynchronous communication task T1 towards task T4 by storing data in the transmitter u1 in accordance with one embodiment of the present invention. In this diagram, the transmitter u1 stores data in its internal memory upon completion of task T1 and starts task T2. When the receiver u2 is ready to perform task T4, it asserts an interrupt 506 to transmitter u1. In response, the transmitter u1 suspends the task T2 to transfer the stored data to receiver u2 in a synchronous manner over a bus rather than a FIFO.

The receiver and transmitter storing methods thus transform asynchronous communication with asynchronous transfer into asynchronous communication with synchronous transfer. These transformed communications are referred herein as "semi-synchronous communication." It should be noted that the transformation may be carried out only if the memory capacity of the transmitter or the receiver is sufficient to store the data in the lifespan of a particular communication. In such instances, the scheduling needs to be modified due to the interrupt.

In general, the generation of interrupts increases processing times. This time increase, referred herein as delta ($\Delta$), is proportional to the interrupt routine execution time. Additionally, the instant of the data transfer will be different from the preliminary schedule. With reference to FIG. 5C, such difference may exist not only after the transmitting task but also before the receiving task. The time increase $\Delta$ also has the effect of modifying the total scheduling, thereby requiring that the temporal constraints are still adhered to. For example, a task associated with an interrupt may be shifted in time due to the use of interrupts along with storing the communication data. Tasks that will be affected by the shift due to interrupts are stored along with the size and the lifespan (e.g., duration) of storage data. This allows a weight to be assigned to a cost $\gamma$ (time of communication, process of silicon, etc.) of the possible transformation of the type of communication. The propagation of $\Delta$ affects task interrupted, other tasks, synchronous communications, and asynchronous communications as follows:

Task interrupted: Tend=Tend+$\Delta$;

Other tasks: Tbegin=Tbegin+$\Delta$; Tend=Tend+$\Delta$;

Synchronous communications: Tbegin=Tbegin+$\Delta$; Tend=Tend+$\Delta$; and

Asynchronous communications:

if $\Delta$ propagated by the extremity of edge: Tend=Tend+$\Delta$; and if $\Delta$ propagated by the origin of edge: Tbegin=Tbegin+$\Delta$.

Figure 1A:
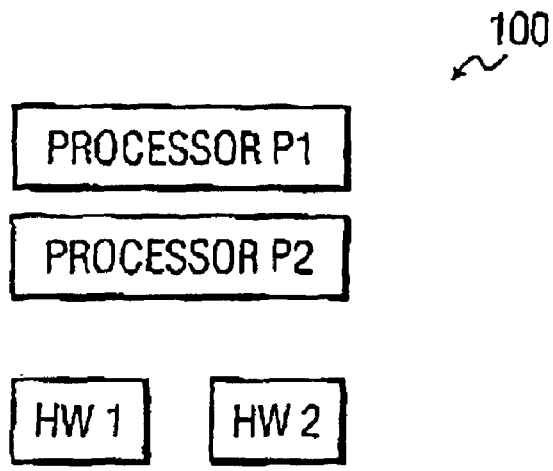
FIG. 1A illustrates a block diagram depicting an exemplary library of design units.
Figure 1B:
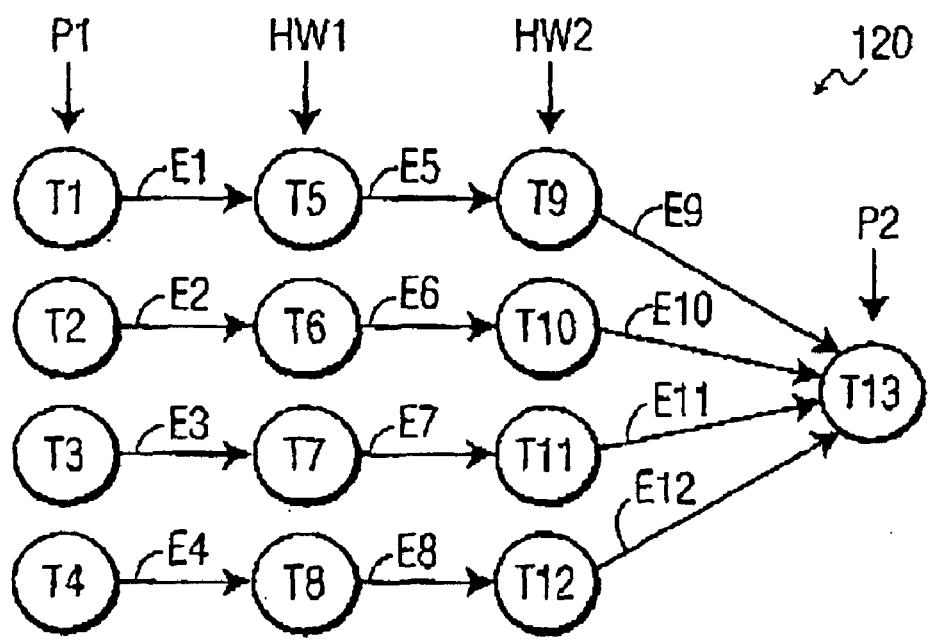
FIG. 1B shows modeling of an application using functions and design units from the library.

Scheduled applications may be represented by a data flow graph where the nodes represent tasks and the edges represent communications between the tasks as in FIG. 1B. In accordance with preferred embodiments, the present invention provides methods of propagation of $\Delta$ on the application schedule that allow the determination of the tasks impacted by the time lag $\Delta$. One method of propagation is provided for storing data in a receiver and another method is provided for storing data in a transmitter. In either of these methods, if the receiver or transmitter unit does not have an interrupt system and/or sufficient space to store the data of asynchronous communication, then the communication transfer cannot be synchronous with receiver storing or transmitter storing communication. In one embodiment, the method proceeds first by the receiver storing communication and if the communication remains asynchronous, the transmitter storing communication is executed.

Figure 6A:
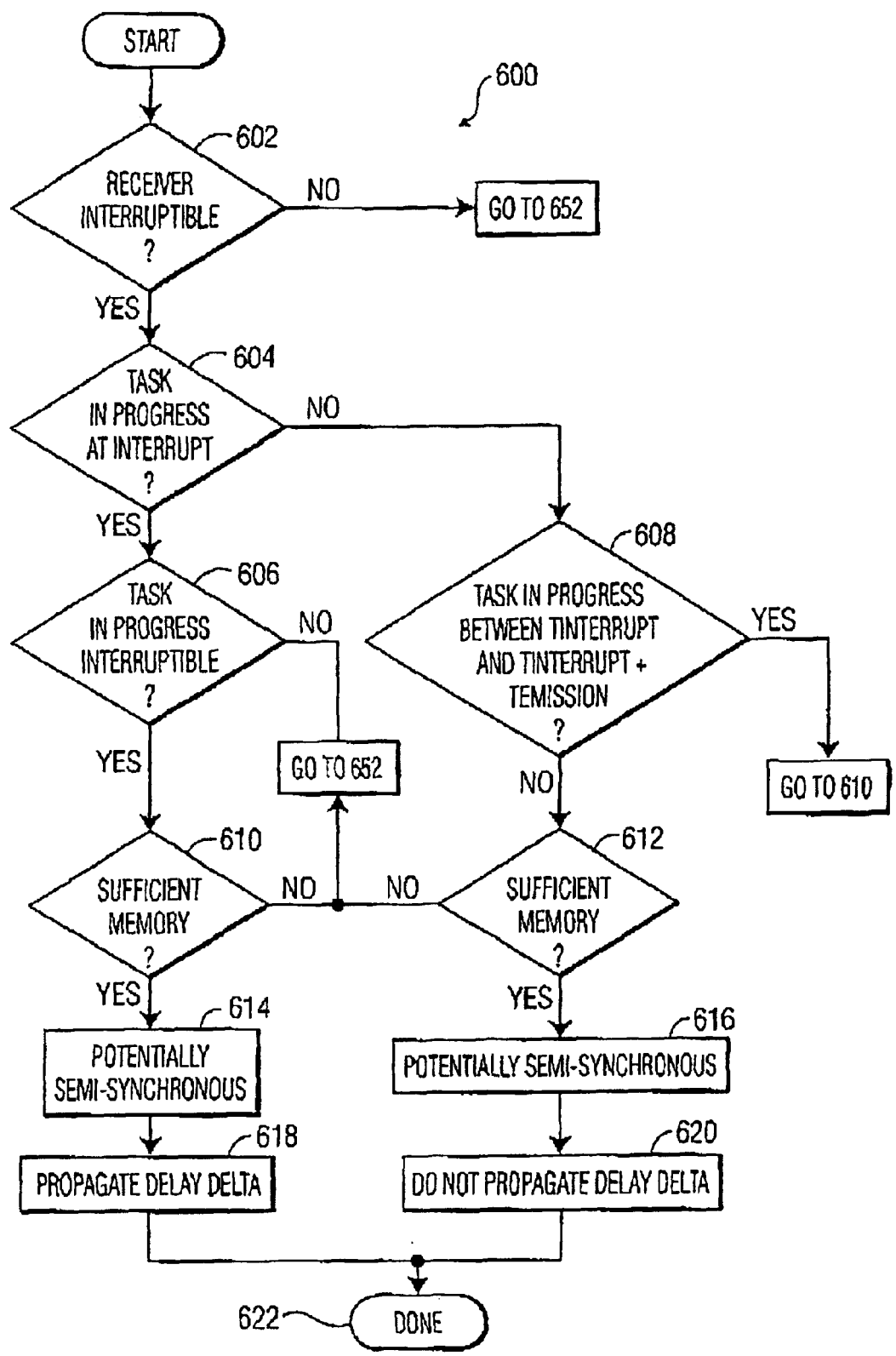
FIG. 6A shows a flowchart of a receiver storing method for determining propagating delays in accordance with one embodiment of the present invention.

FIG. 6A shows a flowchart of a receiver storing method 600 for determining propagating delays in accordance with one embodiment of the present invention. For all asynchronous communications, the receiver storing method 600 determines whether the receiver is interruptible in operation 602. If the receiver is not interruptible, the communication can not be synchronized by the receiver storing method and the method proceeds to operation 652 of FIG. 6B. On the other hand, if the receiver is interruptible, the method proceeds to operation 604 to determine if a task is in progress when the interrupt arrives at the receiver.

If a task is in progress, it is further determined in operation 606 whether the task in progress is interruptible. When the task is determined to be interruptible, the method proceeds to operation 610 to evaluate whether the receiver has sufficient memory space to store the communication data during the lifespan of the communication. If the receiver has sufficient memory space, the communication is classified as potentially semi-synchronous in operation 614 and the delay associated with the interrupt is propagated in operation 618. Otherwise, the communication is determined to be asynchronous and the method proceeds to operation 652 of FIG. 6B.

However, in operation 604, if it is determined that a task is not in progress when an interrupt arrives at the receiver, it is further determined whether the task is in progress in a time interval between Tinterrupt and Tinterrupt+Temission. Preferably, the time interval is ]Tinterrupt, Tinterrupt+Temission]. If so, the method proceeds to operation 612, where it is determined if the receiver has sufficient memory space to store the communication data during the lifespan of the communication. If the receiver has sufficient memory, the communication is classified in operation 616 as potentially semi-synchronous. However, the delay $\Delta$ is not propagated as shown in operation 620. Otherwise, if in operation 608, a task is in progress, this whole task can be shifted by the delay $\Delta$ without being interrupted. In this case, the method proceeds to operation 610. The method then terminates in operation 622.

A task T2 is said to be in direct temporal dependency with a task T1 under certain circumstances. For example, direct temporal dependency exists if tasks T1 and T2 are executed by the same unit and the execution of task T2 starts immediately after the end of execution of task T1. In addition, such condition may exist when the tasks T1 and T2 are executed on two different units and task T2 receives synchronous data from task T1.

In implementing a receiver storing method, the delay $\Delta$ is passed onto all tasks $T_i$ and communications on the receiver after the interrupted task until the receiver task as a time $\alpha$. Additionally, the delay $\Delta$ can be recursively propagated to the tasks that are in direct temporal dependency with tasks $T_i$ with preferably at most one delay per task.

Figure 6B:
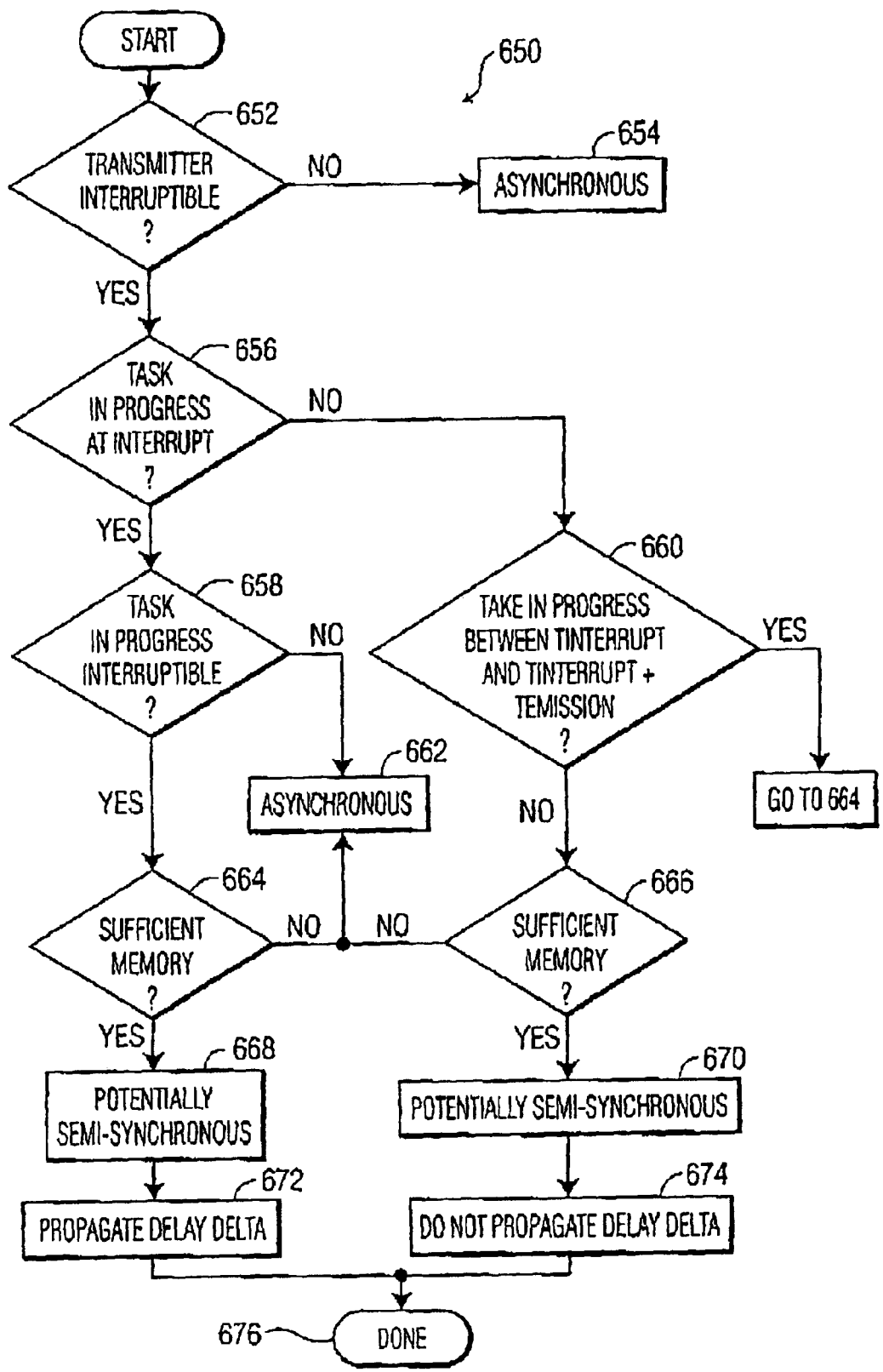
FIG. 6B shows a flowchart of a transmitter storing method for determining propagation delays in accordance with one embodiment of the present invention.

FIG. 6B shows a flowchart of a transmitter storing method 650 for determining propagation delays in accordance with one embodiment of the present invention. As shown, the operations of the transmitter storing method 650 proceeds in a similar manner as the receiver storing method 600 of FIG. 6A. In the transmitter storing method 650, however, the operations are carried out with reference to the transmitter as opposed to the receiver.

When the transmitter storing method is implemented, the delay+$\Delta$ is passed onto all tasks $T_j$ and communications on the receiver unit since the beginning of receiver task until the end of schedule as time interval $\beta$. In addition, the time delay−$\Delta$ is passed onto all tasks $T_k$ and communications on the transmitter unit between the end of transmitter task until the time of interrupt is received interval of time $\chi$. Furthermore, the delay+$\Delta$ is recursively propagated to the tasks that are in direct temporal dependency with tasks $T_j$ with preferably at most one delay per task. Similarly, the delay-Δ is recursively propagated to the tasks that are in direct temporal dependency with task $T_k$ with preferably at most one delay per task.

Figure 7A:
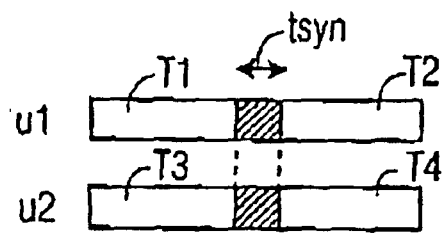
FIG. 7A shows a synchronous communication between transmitter u1 and receiver u2 with synchronization time tsyn.
Figure 7B:
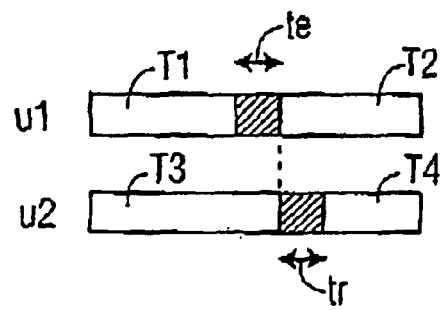
FIG. 7B depicts a data transmission between transmitter u1 and receiver u2 with emission time te and transmission time tr.

With semi-synchronous communications thus defined and with the times associated with these transfer events determined, a communication hardware can be optimized for the synchronous and semi-synchronous types at the same time using a same type of support such as a bus. A communication may be classified synchronous where the supporting hardware is a memory of communication due to a predefined system or the existence of a given asynchronous communication. In this case, the model of data transmission will be different. For example, FIGS. 7A and 7B show two synchronous communication models. Specifically, FIG. 7A shows a synchronous communication between transmitter u1 and receiver u2 with synchronization time tsyn while FIG. 7B depicts a data transmission between transmitter u1 and receiver u2 with emission time te and transmission time tr.

Figure 8A:
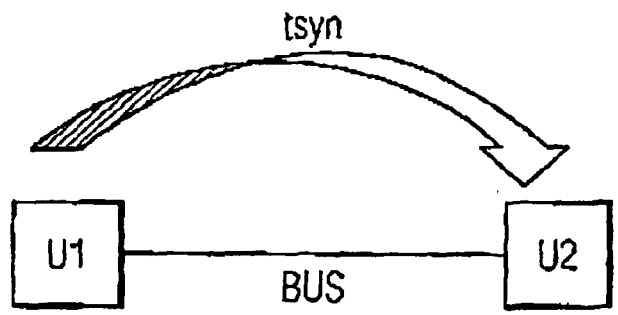
FIG. 8A shows a model representing data transmission across a bus.
Figure 8B:
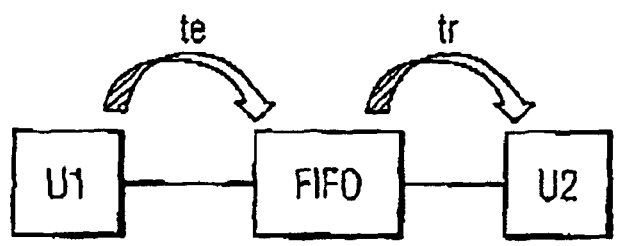
FIG. 8B illustrates a model of data transmission across a communication memory.

In accordance with one embodiment, the synchronous transmission model is adapted according to the existing hardware (predefined system) or potentially added at the stage of determination of asynchronous communication hardware. In the case of a communication memory connecting the units for a synchronous transfer, the synchronization model shown in FIG. 7B is used instead of one in FIG. 7A, adopted in the case of a simple bus. Then, a search weighted bipartite matching algorithm, which is well known, may be used to minimize the number of buses to support all the transfers. FIG. 8A shows a model representing data transmission across a bus. Tsyn is the time to transmit data from transmitter u1 to receiver u2. FIG. 8B illustrates a model of data transmission across a communication memory (e.g., FIFO, dual port, etc.). The emission time te is the time to transmit data from u1 to FIFO and the transmission time tr is the time to transmit data from FIFO to receiver u2. At the end of these two stages, the communications hardware as well as the necessary protocols (synchronous/semi-synchronous/asynchronous) between the units are generated.

Figure 1C:
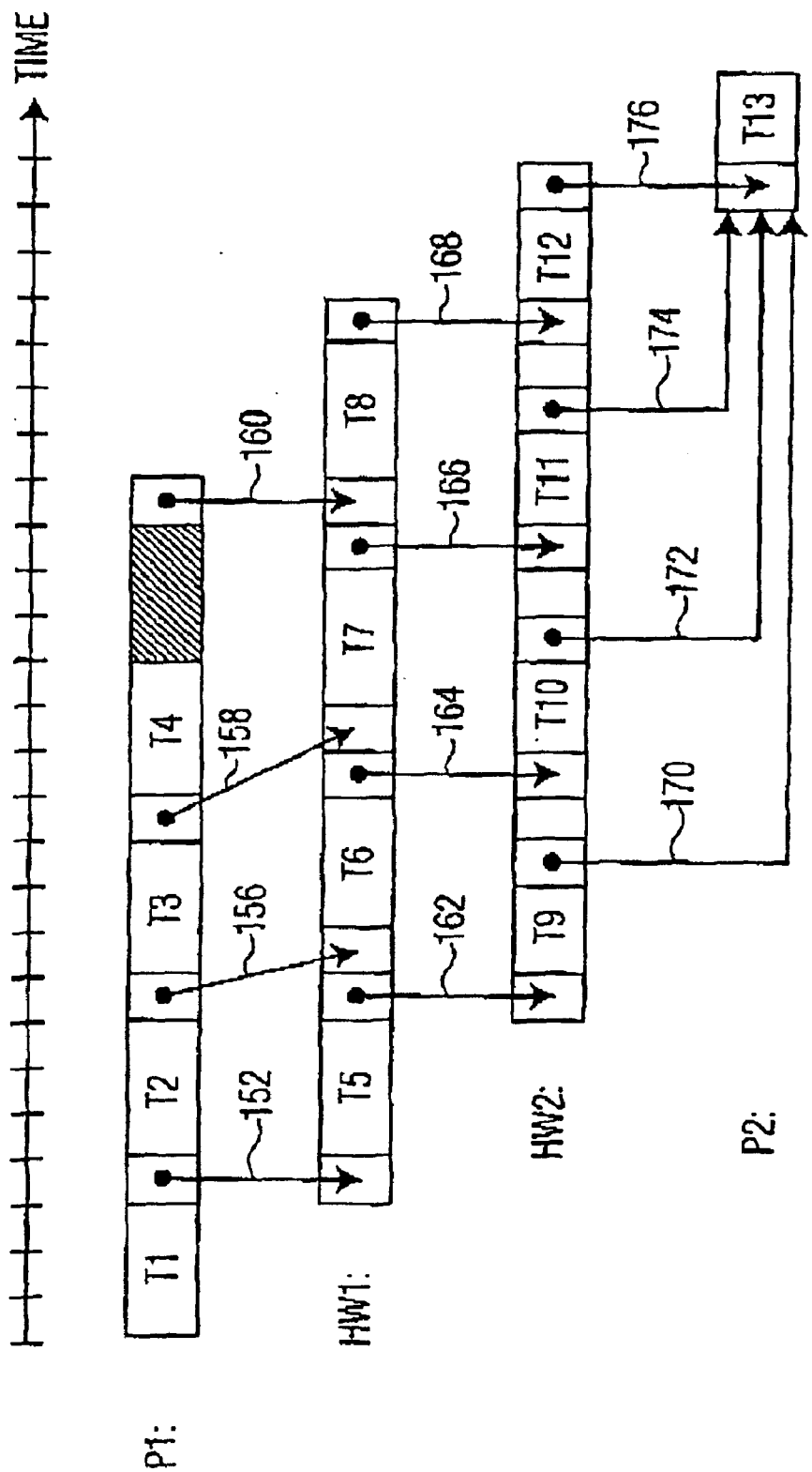
FIG. 1C is a schematic diagram depicting a scheduling of the application modeled in FIG. 1B.
Figure 1D:
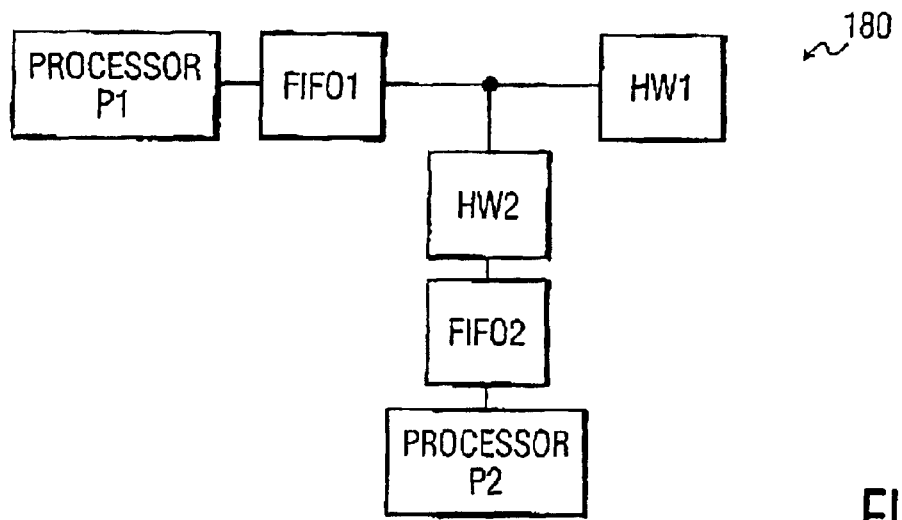
FIG. 1D shows an architecture of a system for the application model of FIG. 1B.
Figure 9A:
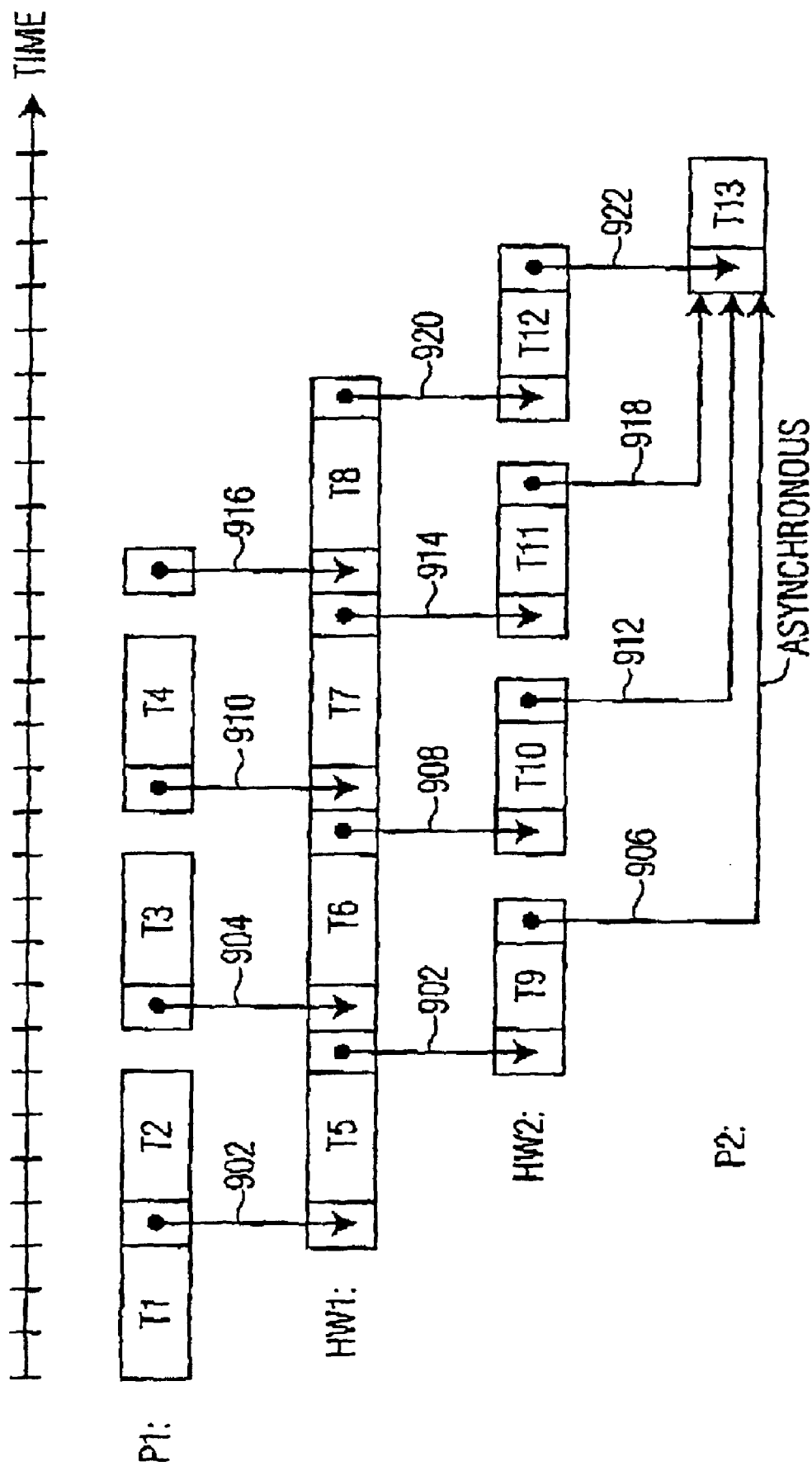
FIG. 9A shows a schematic diagram depicting a scheduling of the application modeled in FIG. 1B.

By way of example, FIG. 9A shows a schematic diagram depicting a scheduling of the application 120 modeled in FIG. 1B. As in FIG. 1C, the schedule diagram schedules assigned tasks of design units as a function of time. In this configuration, task T3 is scheduled late by using mobility of task so that the communications between tasks T2 and T6 become synchronous. Similarly, task T4 is scheduled late so that the communication between tasks T3 and T7 become synchronous.

Figure 9B:
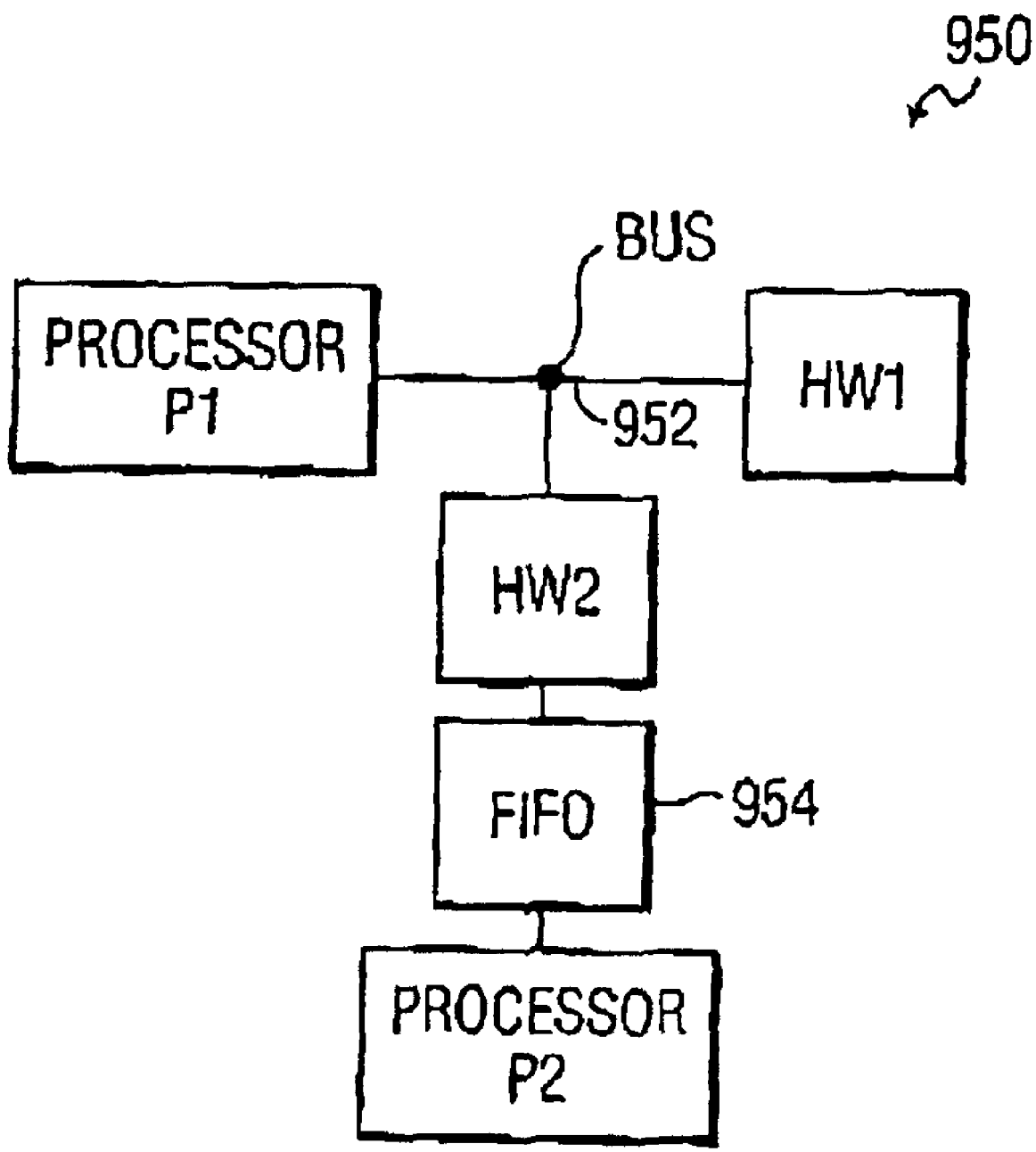
FIG. 9B illustrates a hardware architecture of a system for the application as modified in FIG. 9A.

FIG. 9B illustrates a hardware architecture of a system 950 for the application 120 as modified in FIG. 9A. The system 950 includes a bus 952 instead of a FIFO between processors P1 and HW1. However, the system 950 still includes a FIFO. Thus, although the system 950 requires less chip surface than the system of FIG. 1C, the FIFO 954 still requires larger surface area than a bus.

Figure 10A:
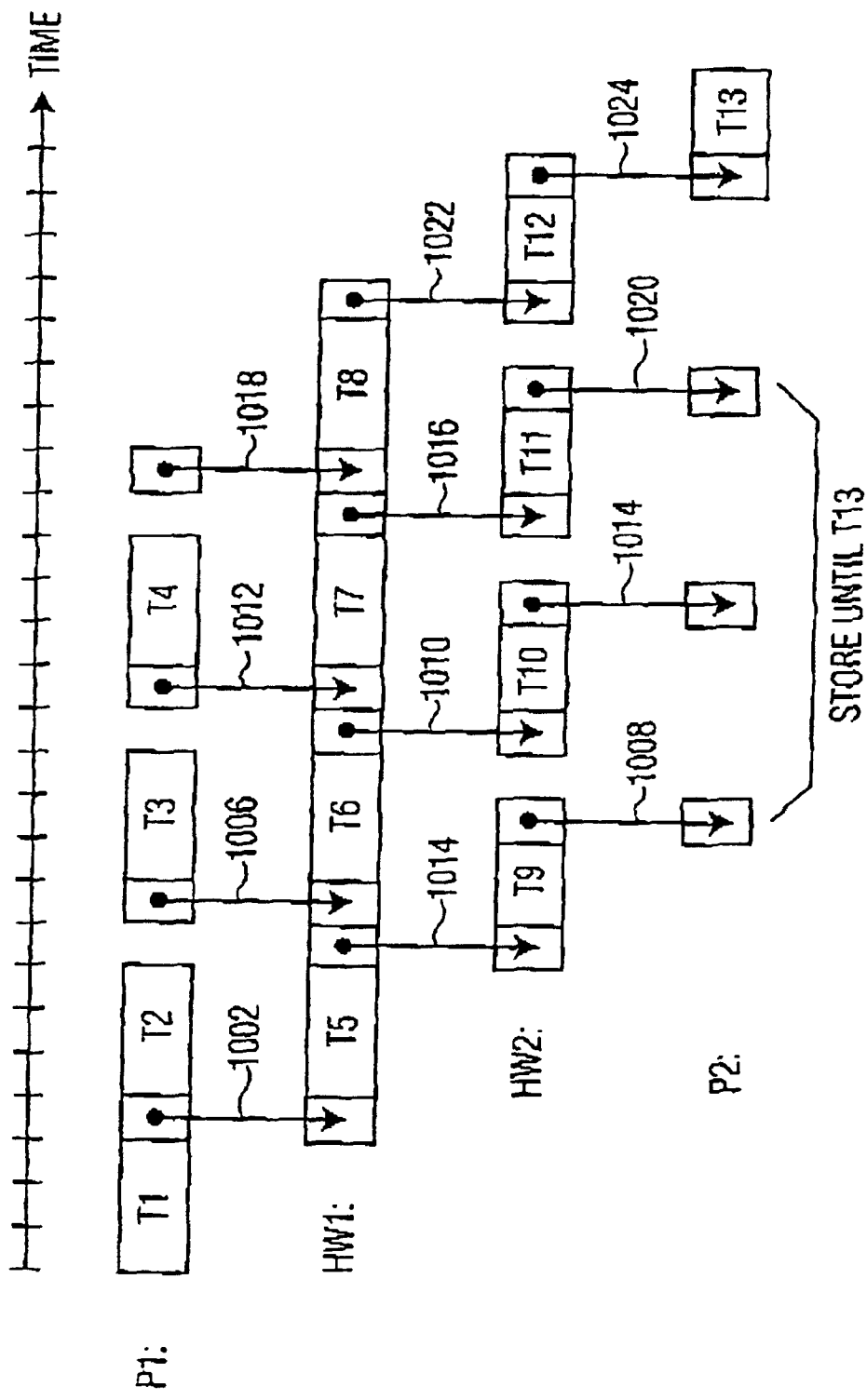
FIG. 10A shows a schematic diagram illustrating a scheduling of the application using interrupt mechanism in accordance with one embodiment of the present invention.

FIG. 10A shows a schematic diagram illustrating a scheduling of the application 120 using interrupt mechanism in accordance with one embodiment of the present invention. As shown, the processor P2 is provided with an interrupt mechanism to generate an interrupt and memory space sufficient for storing data between tasks T9 to T13, tasks T10 to T13, tasks T11 to T13, and tasks T12 to T13. In this configuration, the asynchronous communications between tasks T9 to T13, tasks T10 to T13, tasks T11 to T13, and tasks T12 to T13 are transformed into semi-synchronous using storing receiver method. The processor P2 stores the communicated data until task T13 is ready for execution. It should be noted in using the receiver storing method, the cost from task i to task j, γi/j is as follows: γ9/13=γ11/13=γ10/13=γ12/13=0.

Figure 10B:
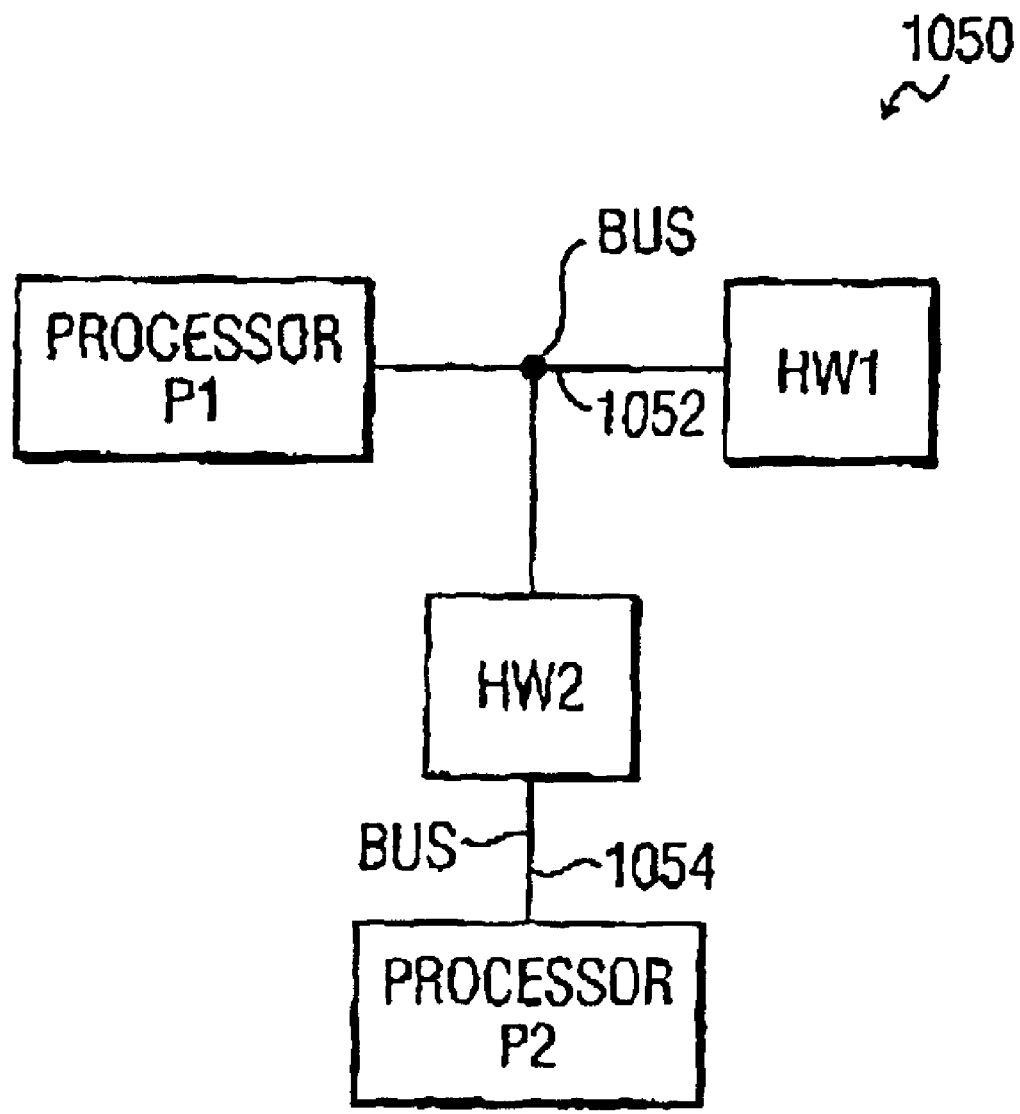
FIG. 10B illustrates a hardware architecture of a system for the application 120 as modified in FIG. 10A.

FIG. 10B illustrates a hardware architecture of a system 1050 for the application 120 as modified in FIG. 10A. The system 1050 now includes two buses 1052 and 1054 without any FIFO. Thus, the system 950 requires significantly less chip surface than the systems of FIGS. 1C and 9B.

The present invention thus uses the mobility of tasks and interrupt driven mechanisms to reduce the data storage requirements. It optimizes surface area within given time constraints by carrying out data transfers between units in a synchronous ways as much as possible. Moreover, the definition of a predefined system can be taken into account in reusing hardware. Also, the method and apparatus of the present invention takes into account the free memory capacity on the unit (space associated with task's local variable for example) to optimize the storage of data to be transferred. With this method, we remove redundant memory associated with communications in multiprocessor systems.

For example, a system based on the BIP37 bi-processor, which has two cores connected by a dual port RAM and 1K RAM by core, may be optimized by determining whether the dual port RAM can be removed for a given application. For example, for a multi-channel audio compression application, the size of memory needed for the asynchronous communication is 1K. This 1K on the BiP3771 represents 15% of the chip area. The present invention allows removal of such memory by storing all the data needed directly in local processor memories.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

APPENDIX

The type of transfer may be determined by mobility of task algorithm as described in A Codesign Experiment in Acoustic Echo Cancellation: GMDFα by M. Israel L. Freund et al., ACM Transactions on Design Automation of Electronics Systems, Vol. 2, No. 4, October 1997, Pages 365–383, which is incorporated herein by reference. After partitioning, a schedule of tasks on functional units (FUs) is provided. The aim is to maximize the use of synchronous communications by local rescheduling of operations. However, even with local rescheduling it is not always possible to use only synchronous communications. In such cases asynchronous communications are requested and both transfer types are used to implement all the communications of the application in the final architecture. The algorithm is based on two functions: Node_characterization and Edge_characterization. For each node $V_i$ Node_characterization computes the mobility interval $\Delta_{M-Vi}$ defined as the interval between the ASAP starting time $ts_{(ASAP)i}$ and the ALAP ending time $te_{(ALAP)i}$.

$$\Delta_{M\_Vi} = [ts_{(ASAP)i}, te_{(ALAP)i}]$$

```
The following algorithm may be used to determine the transfer type:
While all the communication edges are not labeled do
    For each potential synchronous communication edge in the list L do
        Preliminarily schedule the next edge e_{i,j} that is not labeled;
        Analyze the impact of that solution on other communication edges;
        If no asynchronous communication edge is revealed then
            Schedule definitively the edge e_{i,j},
            Label the edge e_{i,j} with a synchronous transfer;
            Reorder the list L;
        End if;
    End for;
    Definitively schedule the edge e_{i,j} that has the lowest cost function ξ_{i,j}
    Label the edge e_{i,j} with a synchronous transfer;
    Remove asynchronous communication edges from the list L;
    Reorder the list L;
End while;
```

Computations of interval mobilities take into account timing constraints. Edge_characterization computes the mobility interval $\Delta_{Meij}$ of a communication edge $e_{ij}$ (edge-connecting nodes assigned to different units) and its mobility value $_{Meij}$. The mobility interval represents all the instants at which a communication between two nodes $V_i$ and $V_j$ can take place:

$$\Delta_{Meij} = [ts_{(ASAP)j}, te_{(ALAP)i}].$$

The value $ts_{(ASAP)j}$ represents the ASAP starting time of the node that receives data and the value $te_{(ALAP)i}$ represents the ALAP ending time of the node that sends data. The mobility value $_{Meij}$ is defined by:

$$_{Meij} = te_{(ALAP)i} - ts_{(ASAP)j}.$$

If $ts_{(ASAP)j} > te_{(ALAP)i}$, then $_{Meij}$ is negative and the communication is asynchronous since there is no timing overlap between the sender and the receiver. Otherwise the communication is considered as potentially synchronous.

The Edge_characterization function also provides a cost value $\xi e_{ij}$ for edges with a potentially synchronous communication which represents the ratio of the amount of data that is transferred through this edge (volume of communication $Ve_{ij}$ and its mobility value:

$$\xi e_{ij} = Ve_{rij} Me_{rij}.$$

Edges that have the highest cost value are considered first since if communications associated with these edges are synchronous, a better hardware minimization is expected.

The algorithm operates as follows (FIG. 8). First, nodes and edges are characterized. And edge $e_{ij}$ is labeled when a transfer type (synchronous or asynchronous) is assigned to this edge. Edges with asynchronous communications (ts$_{(ASAP)j} > te_{(ALAP)i}$, i.e., Me$_{ij} < 0$) are labeled and are not considered for the remainder. The ordered list L of potential synchronous edges is created according to $\xi e_{ij}$. Nodes $V_i$ and $V_j$ corresponding to the first nonlabeled edge $e_{ij}$ of L are preliminarily scheduled (local rescheduling). The impact of this schedule on other communication edges is analyzed by characterizing nodes and edges again. If any communication edge $e_{k,l}$ (k≠i and l≠j) becomes asynchronous, $e_{ij}$ is definitively scheduled and is labeled with a synchronous transfer. Otherwise another nonlabeled edge $e_{ij}$ from L is considered. The process is iterated until all the communication edges that have no impact on other edges are labeled.

After this step remaining potential synchronous edges in L involve at least one asynchronous communication. Let $$\xi_{ij} = (\Sigma \text{ data of asynchronous edges})/(\Sigma \text{ data of synchronous edges})$$

be the cost function associated with $e_{ij}$ defined as the ratio of the total volume of data associated with edges of L that become asynchronous and the total volume of data associated with edges of L that remain synchronous. The edge $e_{ij}$ with $\xi_{ij}$ minimum is labeled with a synchronous transfer since the aim is to minimize the area dedicated to FIFOs.

What is claim is:

1. A method for synthesizing communication support based on communication types of an application, comprising:

providing an application schedule for the application, the application schedule having a plurality of units for performing specified tasks and one or more communication links between the specified tasks;

determining a communication type for each of the communication links in the application schedule as an asynchronous communication or a synchronous communication;

determining, for each of the asynchronous communications, whether each asynchronous communication can be transformed into a semi-synchronous communication that uses an interrupt and a bus to transfer data; and synthesizing a communication support for the semi-synchronous communications as synchronous communications by using the interrupt and the bus;

wherein the interrupt is associated with a time delay Δ, which is propagated in the application schedule.

2. The method as recited in claim 1, further comprising synthesizing the asynchronous communications that are not semi-synchronous communications by using communication memories.

3. The method as recited in claim 1, wherein each of the asynchronous communications originates from a transmitting unit to a receiving unit, and wherein the transmitting unit is adapted to perform a first task for generating communication data and the receiving unit is adapted to receive the communication data for performing a second task.

4. The method of claim 3, wherein, for each of the semi-synchronous communications, the bus is used to couple the transmitting unit and the receiving unit for synchronously transferring the communication data from the transmitting unit to the receiving unit.

5. The method as recited in claim 4, wherein the receiving unit includes an internal memory for storing the communication data, wherein the transmitting unit asserts an interrupt to the receiving unit over the bus and transmits the communication data to the receiving unit for storage in the internal memory.

6. The method as recited in claim 4, wherein the transmitting unit includes an internal memory for storing the communication data, wherein the receiving unit asserts an interrupt to the transmitting unit to transfer the communication data from the internal memory of the transmitting unit when the receiving unit is ready to perform the second task.

7. A method for synthesizing communication support based on communication types of an application, comprising:

providing an application schedule for the application, the application schedule having a plurality of units for performing specified tasks and one or more communication paths between the specified tasks;

determining a communication type for each of the communication paths in the application schedule as an asynchronous communication or a synchronous communication;

determining, for each of the asynchronous communications, whether each asynchronous communication can be transformed into a semi-synchronous communication that uses an interrupt and a bus to transfer data;

synthesizing a first hardware support for the semi-synchronous communications as synchronous communications by using the interrupt and the bus; and synthesizing a second hardware support for the asynchronous communications that are not semi-synchronous communications by using a communication memory;

wherein the interrupt is associated with a time delay Δ, which is propagated in the application schedule.

8. The method as recited in claim 7, wherein each of the asynchronous communications originates from a transmitting unit to a receiving unit, and wherein the transmitting unit is adapted to perform a first task for generating communication data and the receiving unit is adapted to receive the communication data for performing a second task.

9. The method as recited in claim 8, wherein, for each the semi-synchronous communications, the bus is used to couple the transmitting unit and the receiving unit for synchronously transferring the communication data from the transmitting unit to the receiving unit.

10. The method as recited in claim 9, wherein the receiving unit includes an internal memory for storing the communication data, wherein the transmitting unit asserts an interrupt to the receiving unit over the bus and transmits the communication data to the receiving unit for storage in the internal memory.

11. The method as recited in claim 9, wherein the transmitting unit includes an internal memory for storing the communication data, wherein the receiving unit asserts an interrupt to the transmitting unit to transfer the communication data from the internal memory of the transmitting unit when the receiving unit is ready to perform the second task.

12. An integrated circuit design tool for synthesizing communication support based on communication types of an application, comprising:

means for providing an application schedule for the application, the application schedule having a plurality of units for performing specified tasks and one or more communication paths between the specified tasks;

means for determining a communication type for each of the communication paths in the application schedule as an asynchronous communication or a synchronous communication;

means for determining, for each of the asynchronous communications, whether each asynchronous communication can be transformed into a semi-synchronous communication that uses an interrupt and a bus to transfer data;

means for synthesizing a first hardware support for the semi-synchronous communications as synchronous communications by using the interrupt and the bus; and means for synthesizing a second hardware support for the asynchronous communications that are not semi-synchronous communications by using a communication memory;

wherein the interrupt is associated with a time delay Δ, which is propagated in the application schedule.

13. The integrated circuit design tool as recited in claim 12, wherein each of the asynchronous communications originates from a transmitting unit to a receiving unit, and wherein the transmitting unit is adapted to perform a first task for generating communication data and the receiving unit is adapted to receive the communication data for performing a second task.

14. The integrated circuit design tool as recited in claim 13, wherein, for each the semi-synchronous communications, the bus is used to couple the transmitting unit and the receiving unit for synchronously transferring the communication data from the transmitting unit to the receiving unit.

15. The integrated circuit design tool as recited in claim 14, wherein the receiving unit includes an internal memory for storing the communication data, wherein the transmitting unit asserts an interrupt to the receiving unit over the bus and transmits the communication data to the receiving unit for storage in the internal memory.

16. The integrated circuit design tool as recited in claim 14, wherein the transmitting unit includes an internal memory for storing the communication data, wherein the receiving unit asserts an interrupt to the transmitting unit to transfer the communication data from the internal memory of the transmitting unit when the receiving unit is ready to perform the second task.

17. The method of claim 3, wherein determining, for each of the asynchronous communications, whether each asynchronous communication can be transformed into a semi-synchronous communication that uses an interrupt and a bus to transfer data, comprises determining whether the receiving unit is interruptible and whether the receiving unit has sufficient memory to store the data associated with the asynchronous communication.

18. The method of claim 17, further comprising determining whether a task performed by the receiving unit is interruptible.

19. The method of claim 17, wherein determining, for each of the asynchronous communications, whether each asynchronous communication can be transformed into a semi-synchronous communication that uses an interrupt and a bus to transfer data, further comprises determining whether the transmitting unit is interruptible and whether the transmitting unit has sufficient memory to store the data associated with the asynchronous communication.

20. The method of claim 19, further comprising determining whether a task performed by the transmitting unit is interruptible.

* * * * *